United States Patent
Pechaud et al.

(10) Patent No.: US 9,124,258 B2
(45) Date of Patent: Sep. 1, 2015

(54) INTEGRATED CIRCUIT DEVICE, ELECTRONIC DEVICE AND METHOD FOR DETECTING TIMING VIOLATIONS WITHIN A CLOCK SIGNAL

(75) Inventors: Bernard Pechaud, Clermont le Fort (FR); Salem Boudjelel, Daux (FR); Eric Rolland, Grepaic (FR)

(73) Assignee: Freescale Semiconductor, Inc., Austin, TX (US)

( * ) Notice: Subject to any disclaimer, the term of this patent is extended or adjusted under 35 U.S.C. 154(b) by 260 days.

(21) Appl. No.: 13/701,303

(22) PCT Filed: Jun. 10, 2010

(86) PCT No.: PCT/IB2010/001946
§ 371 (c)(1),
(2), (4) Date: Nov. 30, 2012

(87) PCT Pub. No.: WO2011/154763
PCT Pub. Date: Dec. 15, 2011

(65) Prior Publication Data
US 2013/0076398 A1    Mar. 28, 2013

(51) Int. Cl.
G06F 1/00 (2006.01)
H03K 5/26 (2006.01)
G01R 31/317 (2006.01)
H03K 5/19 (2006.01)

(52) U.S. Cl.
CPC ............ *H03K 5/26* (2013.01); *G01R 31/31726* (2013.01); *G01R 31/31727* (2013.01); *H03K 5/19* (2013.01)

(58) Field of Classification Search
CPC .. G01R 1/31726; G01R 1/31727; H03K 5/19; H03K 5/26
USPC ........................................................ 713/500
See application file for complete search history.

(56) References Cited

U.S. PATENT DOCUMENTS

| 6,873,926 | B1* | 3/2005 | Diab ............................. 702/117 |
| 7,590,880 | B1* | 9/2009 | Hershman ..................... 713/502 |
| 7,941,772 | B2 | 5/2011 | Bueti et al. |
| 2003/0053570 | A1 | 3/2003 | Erickson et al. |
| 2007/0008044 | A1 | 1/2007 | Shimamoto |
| 2007/0011634 | A1* | 1/2007 | Negishi ............................ 716/6 |
| 2008/0079463 | A1 | 4/2008 | Wadhwa et al. |
| 2013/0031154 | A1* | 1/2013 | Wiencke et al. .............. 708/629 |

OTHER PUBLICATIONS

International Search Report and Written Opinion correlating to PCT/IB2010/001946 dated Mar. 3, 2011.

* cited by examiner

*Primary Examiner* — Mark Connolly (57) ABSTRACT

An integrated circuit device comprises at least one clock monitor. The at least one clock monitor comprises a timer arranged to receive a clock signal, generate a first timing signal arranged to toggle between states in response to a trigger edge of the clock signal, and generate a second timing signal arranged to toggle between states in response to a trigger edge of the clock signal such that a state transition of the second timing signal in response to a trigger edge of the clock signal is delayed by a period T with respect to the trigger edge of the clock signal in response to which that transition occurs. The at least one clock monitor further comprises a detector arranged to receive at a first input thereof the first timing signal, receive at a second input thereof the second timing signal, compare states of the first and second timing signals, and configure an indication of a timing discrepancy based at least partly on the comparison of the first and second timing signals.

20 Claims, 4 Drawing Sheets

INTEGRATED CIRCUIT DEVICE, ELECTRONIC DEVICE AND METHOD FOR DETECTING TIMING VIOLATIONS WITHIN A CLOCK SIGNAL

FIELD OF THE INVENTION

The field of this invention relates to an integrated circuit device, an electronic device and method for detecting timing violations within a clock signal.

BACKGROUND OF THE INVENTION

In the field of synchronous digital devices, and in particular synchronous digital integrated circuit (IC) devices, if a system clock signal is disturbed by one or several glitches it is typically not possible to guarantee the integrity of data within the system. In particular, if the setup time of internal flip-flops and the like has been violated, the data within the system is compromised and the system may be unable to continue operating correctly. For example, a setup timing violation may result in access time to a memory element being violated or one or more conditions within a state machine of the system being disturbed. A similar problem of the integrity of data being compromised within such a system can occur if the system clock is derived (whether slowly or quickly) to a higher frequency than expected.

Typically within Analogue-Mixed Signal ICs, the system clock is provided by an external microcontroller or an external oscillator. As a result, such a system clock is prone to being disturbed by external environmental conditions of the integrated circuit. With increases in chip scale integration and signal rate, the effect of such external environment conditions on externally provided clock signals is becoming increasingly significant.

SUMMARY OF THE INVENTION

The present invention provides an integrated circuit device and a method for detecting timing violations within a clock signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In summary, some examples of embodiments of the present invention illustrated in the drawings relate to an integrated circuit device, for example an Analogue-Mixed Signal integrated circuit (IC) device, comprising logic arranged to receive a clock signal, generate a first timing signal arranged to toggle between states in response to a trigger edge of the clock signal, and generate a second timing signal arranged to toggle between states in response to a trigger edge of the clock signal such that a state transition of the second timing signal, in response to a trigger edge of the clock signal, is delayed by a period T with respect to the trigger edge of the clock signal in response to which that transition occurs. The logic is further arranged to compare states of the first and second timing signals, and configure a timing violation signal based at least partly on the comparison of the first and second timing signals.

Figure 1:
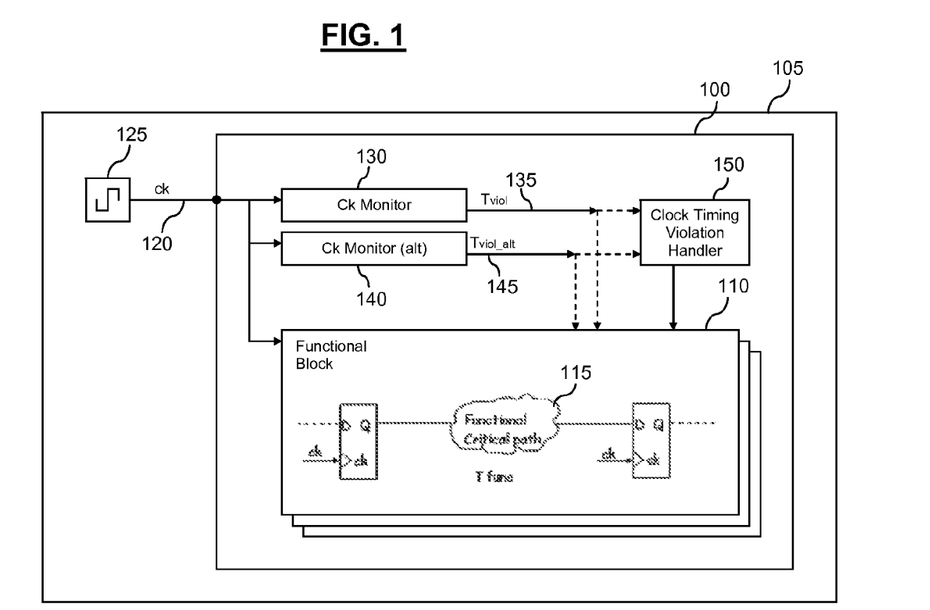
FIG. 1 illustrates an example of an electronic device comprising an integrated circuit device.

Referring now to FIG. 1, there is illustrated an example of an electronic device 105 comprising an integrated circuit device 100. The integrated circuit device 100 comprises one or more functional blocks, illustrated generally at 110. In particular for the illustrated example, the integrated circuit device 100 comprises one or more functional blocks 110 comprising synchronous digital functional units (not shown), and the integrated circuit device 100 is arranged to receive a clock signal 120 from an external clock source 125, for example comprising an external microcontroller or an external oscillator. The clock signal 120 is provided to one or more of the functional blocks 110 to provide a system clock signal to synchronous digital functional units therein.

The integrated circuit device 100 of the illustrated example further comprises a clock monitor 130, which is also arranged to receive the clock signal 120, to detect whether a timing violation has occurred within the clock signal 120, and to output an indication of whether a timing violation has been detected by way of clock timing violation signal ($T_{viol}$) 135. In particular, in one example, the clock monitor 130 is arranged to generate a first timing signal arranged to toggle between states in response to a trigger edge of the clock signal 120. The clock monitor 130 is also arranged to generate a second timing signal arranged to toggle between states in response to a trigger edge of the clock signal 120, to compare states of the first and second timing signals and to configure the clock timing violation signal 135 based at least partly on the comparison of the first and second timing signals.

In the above example, the electronic device 105 comprises the integrated circuit 100, which in turn comprises components, electronic circuits and/or logic elements in accordance with example embodiments of the invention. In other examples, the electronic device 105 may comprise individual or multiple components, electronic circuits and/or logic elements equivalent to those described with respect to the integrated circuit 100, without such components, electronic circuits and/or logic elements being contained within an integrated circuit package.

Figure 2:
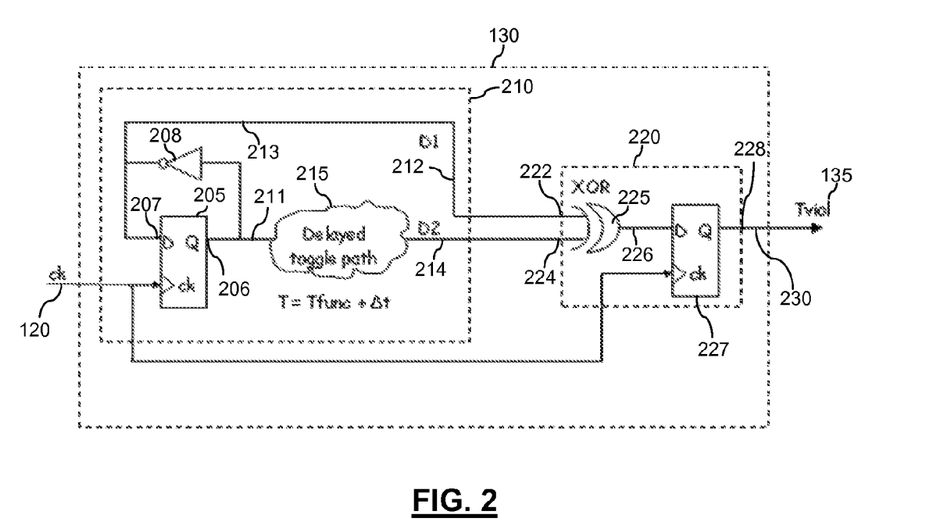
FIG. 2 illustrates an example of a clock monitor.

Referring now to FIG. 2, there is illustrated an example of one implementation of the clock monitor 130. For the illustrated example, the clock monitor 130 comprises a timer 210 arranged to receive the clock signal 120 and to generate a first timing signal (D1) 212 arranged to toggle between states in response to a trigger edge of the clock signal 120, and to generate a second timing signal (D2) 214 arranged to toggle between states in response to a trigger edge of the clock signal 120, such that a state transition of the second timing signal 214 in response to an active state of the clock signal 120 is delayed by a period T with respect to the trigger edge of the clock signal (120) in response to which that transition occurs.

For example, and as illustrated in FIG. 2, the timer 210 comprises a flip-flop circuit 205 arranged to receive the clock signal 120, and to set an output 206 thereof. In one example, the output may be arranged to be equal to an input 207 thereof upon each trigger edge of the clock signal 120. The output 206 of the flip-flop 205 is operably coupled to the input 207 of the flip-flop 205 via an inverter 208. In this manner, the output 206 of the flip-flop 205 is arranged to toggle between high and low states in response to trigger edges of the clock signal 120, and as such provides a seed timing signal 211.

For the illustrated example, the timer 210 is arranged to generate the first timing signal 212 by propagating the seed timing signal 211 through a first timing signal path 213, which for the illustrated example comprises the inverter 208. Conversely, the timer 210 is arranged to generate the second timing signal 214 by propagating the seed timing signal 211 through a second timing signal path 215, wherein the second timing signal path is arranged to cause a delay of state transitions within the second timing signal 214 with respect to trigger edges of the clock signal 120, in response to which such transitions occur.

For the illustrated example, the first timing signal path 213 comprises substantially no further components other than the inverter 208, and as such for the illustrated example the first timing signal (D1) 212 substantially comprises an inverted version of the seed timing signal 211. In contrast, the second timing signal path 215 is arranged to cause a delay of state transitions within the second timing signal 214 comprising a period T, where the period T is configured to substantially equal $T_{func}+\Delta t$, where $T_{func}$ represents, for example, a signal propagation time for a critical path within at least one functional block 110 of the integrated circuit device 100, and $\Delta t$ represents a differential timing offset value. As such, for the illustrated example, the second timing signal D2 (214) effectively comprises a delayed version of the seed timing signal 211, delayed by a period T. For example, at least a part of the second timing signal path 215 may comprise one or more components (not shown) that is/are representative of components within a critical path of one or more of the functional blocks 110, such as the critical path illustrated generally at 115.

In one example, as illustrated, the clock monitor 130 of FIG. 2 further comprises a detector 220 arranged to receive at a first input 222 thereof the first timing signal 212 and at a second input 224 thereof the second timing signal 214. The detector 220 is further arranged to compare the logic states of the received first and second timing signals 212, 214 and to configure an indication of a timing discrepancy 230 based at least partly on the comparison of the first and second timing signals 212, 214.

For example, the detector 220 illustrated in FIG. 2 comprises a comparator 225 arranged to receive at first and second inputs thereof (which for the illustrated example comprise the first and second inputs 222, 224 of the detector 220) the first and second timing signals 212, 214. The comparator 225 compares the logic states of the received first and second timing signals 212, 214 and outputs an indication 226 of whether the states of the first and second timing signals are counterpart states. As mentioned above, for the illustrated example the timer 210 is arranged to generate the second timing signal (214) such that a state transition of the second timing signal, in response to a trigger edge of the clock signal, comprises an inverse of a transition of the first timing signal in response to the same trigger edge of the clock signal. That is to say, the first timing signal (D1) 212 substantially comprises an inverted version of the seed timing signal 211, whilst the second timing signal D2 (214) effectively comprises a non-inverted, albeit delayed, version of the seed timing signal 211. Accordingly, counterpart states of the first and second timing signals 212, 214 (i.e. states of the first and second timing signals 212, 214 corresponding to a common trigger edge of the clock signal 120) for the illustrated example comprise opposing states (if the delay is relatively small with respect to the duty cycle of the timing signal); e.g. if the first timing signal 212 comprises a 'HIGH' or '1' logical state, the counterpart state for the second timing signal 214 comprises a 'LOW' or '0' logical state, and vice versa. As such, for the illustrated example, the comparator 225 comprises an exclusive OR (XOR) gate, whereby the comparator 225 outputs a 'TRUE' or logic '1' signal if one of the received timing signals 212, 214 is 'HIGH' and the other 'LOW', and outputs a 'FALSE' or logic '0' signal if both of the received timing signals 212, 214 are 'HIGH' or 'LOW'. Thus, the comparator 225 is arranged to output a 'TRUE' or '1' signal when the states of the first and second timing signals (212, 214) are counterpart states, and a 'FALSE' or '0' signal when the states of the states of the first and second timing signals (212, 214) are not counterpart states.

Examples of the present invention are not limited to the timer 210 being arranged to generate the second timing signal 214, such that a state transition of the second timing signal in response to a trigger edge of the clock signal comprises an inverse of a transition of the first timing signal in response to the same trigger edge of the clock signal. For example, the timing seed signal 211 may be output substantially directly by the timer 210 to provide the first timing signal 212 (as opposed to passing the timing seed signal 211 through the inverter 208). As such, counterpart states of the first and second timing signals 212, 214 (e.g. states of the first and second timing signals 212, 214 corresponding to a common trigger edge of the clock signal 120), for such an alternative example, would comprise matching states; e.g. if the first timing signal 212 comprises a 'HIGH' or '1' logical state, the counterpart state for the second timing signal 214 comprises a 'HIGH' or '1' logical state, etc.

Furthermore, the comparator 225 in other examples may comprise an alternative form of logic gate, for example such as an exclusive NOR (XNOR) gate, or collection of 'AND', 'OR', and/or inverter logic elements, etc.

The detector 220 for the illustrated example further comprises a timing violation detector 227 arranged to detect timing discrepancies within the clock signal 120. For the illustrated example, the timing violation detector 227 is arranged to detect instances of non-counterpart states of the timing signals 212, 214 that occur substantially concurrently with a reference timing signal, which for the illustrated example comprises the clock signal 120. In particular for the illustrated example, the timing violation detector 227 comprises a flip-flop circuit, and is arranged to receive the indication 226 of whether the states of the first and second timing signals 212, 214 are counterpart states output by the comparator 225, and the clock signal 120, and upon a trigger edge of the clock signal 120, for example to set an output 228 thereof equal to the indication 226 of whether the states of the first and second timing signal 212, 214 are counterpart states. Thus, by setting the output 228 equal to the indication 226 upon trigger edges of the clock signal 120, the timing violation detector 227 is arranged to provide an indication of a timing discrepancy 230, as described in greater detail below. For the example illustrated in FIG. 2, the indication of a timing discrepancy 230 output by the timing violation detector 227 is used to provide the clock timing violation signal ($T_{viol}$) 135.

Figure 3:
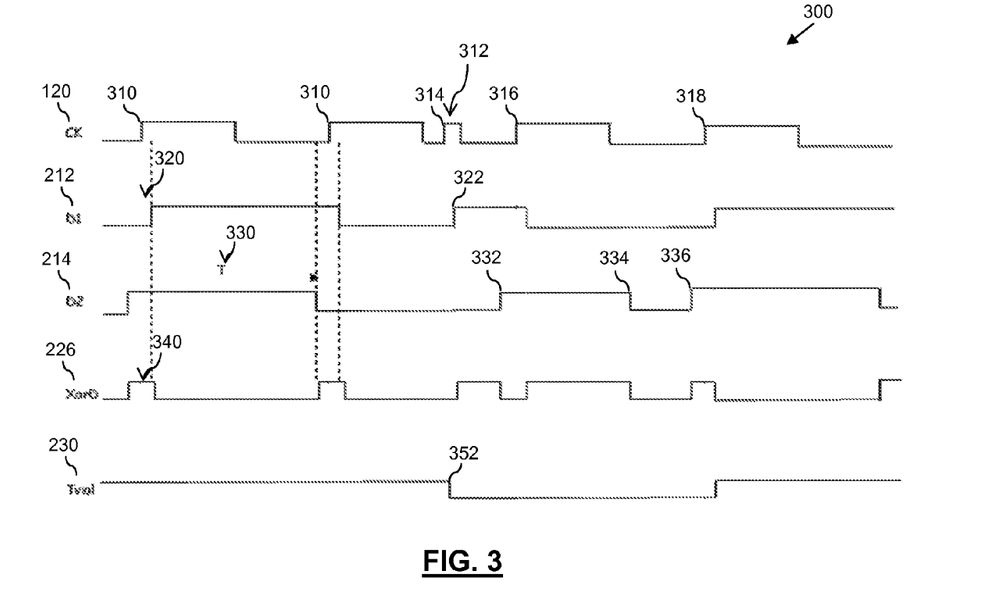
FIGS. 3 and 4 illustrate examples of timing diagrams for signals within the clock monitor of FIG. 2.
Figure 4:
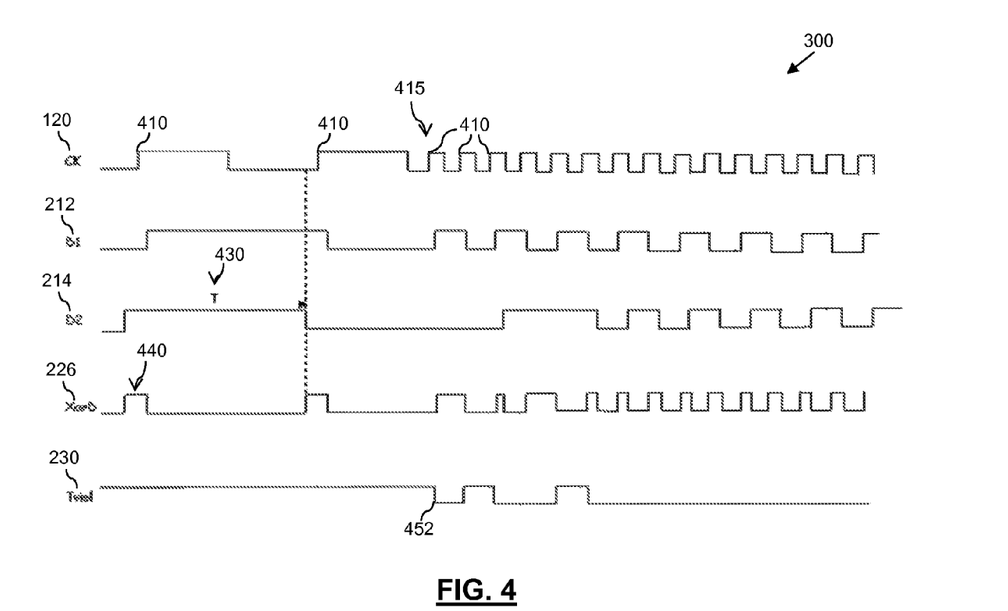

FIGS. 3 and 4 illustrate examples of timing diagrams for signals within the clock monitor 130 of FIG. 2. Referring first to FIG. 3, there is illustrated a timing diagram 300 comprising a first plot illustrating the clock signal 120 received by the integrated circuit device 100. The timing diagram 300 further comprises plots for the first and second timing signals 212, 214 output by the timer 210, the indication 226 of whether the states of the first and second timing signals are counterpart states output by the comparator 225, and the indication of a timing discrepancy 230 output by the detector 220.

In some examples, the first timing signal (D1) 212 is arranged to toggle between states in response to a trigger edge of the clock signal 120, and the second timing signal (D2) 214 is arranged to toggle between states in response to a trigger edge of the clock signal 120 such that a state transition of the second timing signal 214 in response to an trigger edge of the clock signal 120 is delayed by a period T with respect to the trigger edge of the clock signal 120. For the illustrated example, trigger edges of the clock signal 120 comprise rising edges of the clock signal 120, as indicated at 310. However, in alternative examples, trigger edges of the clock signal 120 may additionally/alternatively comprising falling edges of the clock signal 120.

As illustrated in FIG. 3, the first timing signal (D1) 212 in this example is arranged to toggle between states soon after each trigger edge 310 of the clock signal 120. In practise, there may typically be a slight delay, as indicated at 320, between a trigger edge 310 of the clock signal 120 and a state transition of the first timing signal (D1) 212 due to, for the example illustrated in FIG. 2, the need for the state transition to propagate through the flip-flop 205 and the inverter 208. In contrast, a state transition of the second timing signal (D2) 214, in response to a trigger edge 310 of the clock signal 120, is delayed by a period T with respect to the trigger edge 310 of the clock signal 120, in response to which that transition occurs, as illustrated at 330. The period T is configured such that, under normal operating conditions, it is shorter than a period between trigger edges 310 of the clock signal 120. In this manner, under normal operating conditions, the transitions for both the first and second timing signals 212, 214 in response to one trigger edge 310 of the clock signal 120 will have completed before the next active clock edge 310. Thus, and as indicated generally at 340, the indication 226 of whether the states of the first and second timing signals are counterpart states output by the comparator 225 will indicate under normal operating conditions that the states of the first and second timing signals are counterpart states (as illustrated by a '1' or 'HIGH' state in the illustrated example).

The timing diagram 300 of FIG. 3 illustrates what happens when a 'glitch' 312 occurs in the clock signal. Here, the glitch 312 comprises an additional and notably out-of-sync trigger edge 314 within the clock signal 120. The out-of-sync trigger edge 314 causes the timing signals 212, 214 to toggle sooner than would be the case under normal operating conditions. Specifically, because the out-of-sync trigger edge 314 has occurred before the expiry of the period T since the previous trigger edge 310 of the clock signal 120, the transition of the second timing signal 214 in response to the previous trigger edge 310, indicated at 332, has yet to occur when the out-of-sync trigger edge 314 of the clock signal 120 occurs. As a result, at the time of the out of sync trigger edge 314 of the clock signal 120, the first and second timing signals 212, 214 comprise non-counterpart states. Accordingly, when the timing violation detector 227 sets its output 228 equal to the indication 226 in response to the out-of-sync trigger edge 314 of the clock signal 120, the output 228 of the timing violation detector 227 becomes set to a '0', thereby indicating that a timing discrepancy has been detected, as indicated at 352.

Upon the next (intentional) trigger edge 316 of the clock signal 120, the timing signals 212, 214 are again caused to toggle between states. For this next trigger edge 316, the transition 332 of the second timing signal 214 in response to the trigger edge 310 preceding the out-of-sync trigger edge 314 will have occurred. However, the transition of the first timing signal 212 in response to the out-of-sync clock edge 314, indicated at 322, which occurred soon after the out-of-sync clock edge 314, means that the first and second timing signals 212, 214 still comprise non-counterpart states. Accordingly, when the timing violation detector 227 sets its output 228 equal to the indication 226 in response to the out-of-sync trigger edge 314 of the clock signal 120, the output 228 of the timing violation detector 227 remains set to a '1', indicating that a timing discrepancy has been detected. By the time the next (intentional) trigger edge 318 of the clock signal 120 occurs, the transitions of the second timing signal 214 in response to the previous two trigger edges 314, 316 (one of which is the out-of-sync trigger edge) will have occurred, along with the transition of the first timing signal 212 in response to the previous (intentional) trigger edge 316. As a result, the first and second timing signals 212, 214 now comprise counterpart states. Accordingly, when the timing violation detector 227 sets its output 228 equal to the indication 226, in response to the out-of-sync trigger edge 314 of the clock signal 120, the output 228 of the timing violation detector 227 becomes set to a '1', no longer indicating that a timing discrepancy has been detected.

In this manner, if a glitch occurs within the clock signal 120, such that a period between consecutive trigger edges of the clock signal is less than the period T, the timing violation detector 227 will output an indication that a timing discrepancy has been detected. Significantly, and as illustrated in the timing diagrams, such an indication of a timing discrepancy is provided substantially immediately, and in particular well within a single clock cycle. As a result, such an expeditious indication of a timing discrepancy enables appropriate action to be taken substantially before errors that might result from such a glitch are able to seriously compromise data or the system of which the integrated circuit device 100 forms a part. For example, such an indication may be provided to a microcontroller or the like, and upon receipt of an indication that a timing discrepancy has been detected, the microcontroller may cause the functional blocks 110 of the integrated circuit device 100 to which the clock signal 120 is provided to go into a 'safe' mode, or to revert to a default or saved state from which the functional blocks 110 may recover and resume normal operation. Thus, by configuring the period T such that it is substantially equal to a minimum acceptable period between trigger edges of the clock signal, occurrences of consecutive trigger edges within the clock signal that are too close to one another, for example as a result of a glitch in the clock signal or the like, may be expeditiously detected.

Referring now to FIG. 4, there is illustrated a timing diagram 400 comprising a first plot showing one example of the clock signal 120 received by the integrated circuit device 100. The timing diagram 400 further comprises plots showing the first and second timing signals 212, 214 output by the timer 210, the indication 226 of whether the states of the first and second timing signals are counterpart states output by the comparator 225, and the indication of a timing discrepancy 230 output by the detector 220.

Once again, the first timing signal (D1) 212 is arranged to toggle between states in response to a trigger edge of the clock signal 120, and the second timing signal (D2) 214 is arranged to toggle between states in response to a trigger edge of the clock signal 120, such that a state transition of the second timing signal 214, in response to an active of the clock signal 120, is delayed by a period T with respect to the trigger edge of the clock signal 120. For the illustrated example, trigger edges of the clock signal 120 comprise rising edges of the clock signal 120, as indicated at 410.

The first timing signal (D1) 212 is arranged to toggle between states soon after each trigger edge 410 of the clock signal 120. In contrast, a state transition of the second timing signal (D2) 214, in response to a trigger edge 410 of the clock signal 120, is delayed by a period T with respect to the trigger edge 410 of the clock signal 120 in response to which that transition occurs, as illustrated at 430. The period T is configured such that, under normal operating conditions, it is shorter than a period between trigger edges 410 of the clock signal 120. In this manner, under normal operating conditions, the transitions for both the first and second timing signals 212, 214 in response to one trigger edge 410 of the clock signal 120 will have completed before the next active clock edge 410. Thus, and as indicated generally at 440, the indication 226 of whether the states of the first and second timing signals are counterpart states output by the comparator 225 will indicate under normal operating conditions that the states of the first and second timing signals are counterpart states (as illustrated by a '1' or 'HIGH' state in the illustrated example).

As previously mentioned, in accordance with some example embodiments of the present invention, the period T may be configured to substantially equal $T_{func}+\Delta t$, where $T_{func}$ represents, for example, a signal propagation time for a critical path within a functional block 110 of the integrated circuit device 100, and $\Delta t$ represents a differential timing offset value. If the period between two consecutive trigger edges 410 of the clock signal 120 falls below the time taken for a signal to propagate through a critical path of the integrated circuit device 100 (i.e. $T_{func}$), then a timing violation will occur for that critical path, and the integrity of data may be compromised. Accordingly, by configuring the period T by which the second timing signal is delayed to be approximately equal to the time taken for a signal to propagate through a critical path ($T_{func}$), if the period between two consecutive trigger edges 410 of the clock signal 120 falls below this period, the detection of a timing discrepancy will be indicated by the timing violation detector 227, providing a warning that a timing violation may have occurred for that critical path, and that the integrity of data may have been compromised.

In this manner, not only will the detection of a timing discrepancy be indicated by the timing violation detector 227 in the case of a 'glitch', as in the case illustrated in FIG. 3, but also in a case where an operating frequency of the clock signal 120 is set too high, or for some other reason increases to a rate too high for the critical path to function correctly with. For example, as illustrated generally at 415, the clock frequency increases from a rate in which the period between consecutive trigger edges of the clock signal 120 is greater than T, as indicated by trigger edges 410, to a rate in which the period between consecutive trigger edges of the clock signal 120 is less than T, as indicated by trigger edges 417. In the same manner as for the case illustrated in FIG. 3, as soon as a trigger edge 417 of the clock signal occurs within the period T since a previous trigger edge, the output 228 of the timing violation detector 227 becomes set to a '0', indicating that a timing discrepancy has been detected, as indicated at 452.

The addition of $\Delta t$ to an estimate of a minimum required signal propagation time for a critical path ($T_{func}$) not only allows for a margin of error in terms of estimating a required minimum required signal propagation time for a critical path ($T_{func}$), but also enables an indication of a timing discrepancy to be provided before the clock frequency increases to too high a rate in the case where the clock frequency is increasing in continuous (ramped) manner.

Referring back to FIG. 1, in one example the clock timing violation signal ($T_{viol}$) 135 output by the clock monitor 130 may be provided to a dedicated clock timing violation handler 150, which upon receipt of an indication of a clock timing violation may cause the functional blocks 110 of the integrated circuit device 100 to which the clock signal 120 is provided to go into a 'safe' mode, or to revert to a default or saved state from which the functional blocks 110 may recover and resume normal operation. Alternatively, the clock timing violation signal ($T_{viol}$) 135 may be provided to clock timing violation handling circuitry within one or more of the functional blocks 110 themselves, which upon receipt of an indication of a clock timing violation may cause one or more of the functional blocks 110 of the integrated circuit device 100 to which the clock signal 120 is provided to go into a 'safe' mode, or to revert to a default or saved state from which the one or more of the functional blocks 110 may recover and resume normal operation.

For the illustrated example, the integrated circuit device 100 comprises an additional clock monitor 140. For example, the additional clock monitor 140 may be arranged to provide redundant clock monitoring functionality such that, if a fault or error occurs within the first clock monitor 130 such that the first clock monitor fails to detect a clock timing violation, the clock timing violation may still be detected by the redundant clock monitor 140, and signalled to, for example, the clock timing violation handler 150. In accordance with some example embodiments, the clock monitor blocks 130, 140 may be physically separated in the layout of the integrated circuit device 100. In this manner, varying effects of temperature and process with respect to the separate locations of the clock monitor blocks 130, 140 may also be taken into consideration.

Alternatively, as previously described, the first clock monitor 130 may comprise a timing signal module arranged to generate a second timing signal for which state transitions are delayed by a period T with respect to the trigger edge of the clock signal. In accordance with some examples, the period T may be configured to equal $T_{func}+\Delta t$, where $T_{func}$ represents a signal propagation time for a first critical path within a functional block of the integrated circuit device. The second clock monitor 140 may comprise a timing signal module arranged to generate a second timing signal for which state transitions may be delayed by a period $T_2$ with respect to the trigger edge of the clock signal. For example, the period $T_2$ may be configured to equal $T_{func2}+\Delta t$, where $T_{func2}$ represents a signal propagation time for a second critical path within a functional block of the integrated circuit device. In this manner, timing violations of the clock signal may be detected with respect to different critical paths within the integrated circuit device in order to take into consideration, say, varying effects of temperature and the like on the different critical paths.

For the example embodiment illustrated in FIG. 2, the clock monitor 130 is arranged to output, via the clock timing violation signal 135, an indication of a clock timing violation signal upon detection of a single timing discrepancy, which for the illustrated example comprises a single instance of non-counterpart states of the timing signals 212, 214 occurring substantially concurrently with a trigger edge of the clock signal 120. In this manner, a single timing discrepancy within the clock signal 120 may be detected and indicated substantially immediately (e.g. within a single clock cycle), thereby enabling corrective actions to be initiated, or for the system to be reset or put in a safe mode, substantially immediately upon detection of such a timing discrepancy. However, in other examples, some systems may be capable of tolerating a small number of timing discrepancies before such discrepancies are likely to cause serious timing violations to occur within the system, or for data integrity to be seriously compromised. Accordingly, for such examples, the clock monitor 130 of FIG. 1 may be arranged to output an indication of a clock timing violation upon detection of a predefined, and/or configurable, number of timing discrepancies.

Figure 5:
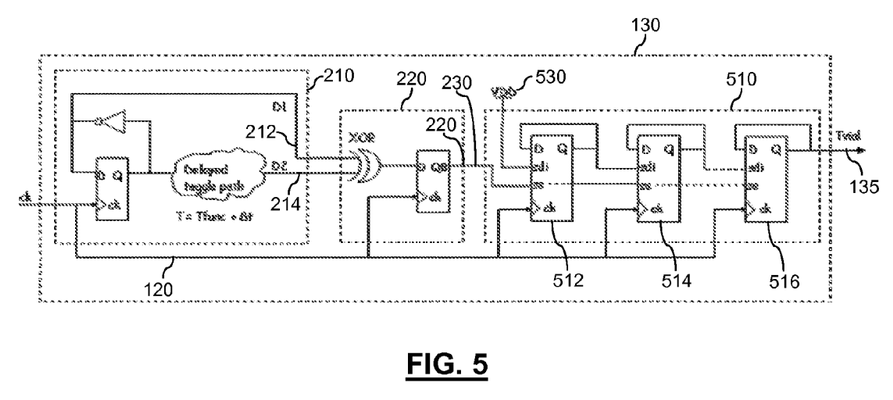
FIG. 5 illustrates an alternative example of a clock monitor.

FIG. 5 illustrates an alternative example of an implementation of the clock monitor 130 of FIG. 1, in which the clock monitor 130 is arranged to output an indication of a clock timing violation signal upon detection of n timing discrepancies. In the same manner as for the example illustrated in FIG. 2, the clock monitor 130 of FIG. 5 may comprise a timer 210 arranged to receive the clock signal 120 and to generate first and second timing signals 212, 214. The clock monitor 130 of FIG. 5 may also comprise a detector 220 arranged to receive the first and second timing signals 212, 214, and to output 228 a timing discrepancy indication 230.

In contrast to the example illustrated in FIG. 2, the clock monitor 130 of FIG. 5 may further comprise a clock timing violation signal configuration module 510 operably coupled to the output 228 of the detector 220 and arranged to receive the indication of a timing discrepancy 230 output by the detector 220 and to configure the clock timing violation signal 135 based at least partly on a number n of indicated timing discrepancies. The clock timing violation signal configuration module 510, for the illustrated example, comprises a counter arranged to receive the indication of a timing discrepancy 230 and the clock signal 120, and to 'count' a number of trigger edges of the clock signal upon which a timing discrepancy is indicated. In particular for the illustrated example, the clock timing violation signal configuration module 510 comprises n 'scan flip-flops', of which three such flip-flops 512, 514, 516 are illustrated in FIG. 5.

The flip-flops 512, 514, 516 of the clock timing violation signal configuration module 510 are operably coupled, for example in a shift register configuration, such that an output (Q) of a first flip-flop 512 is fed back into a first input (D) of the first flip-flop 512 and into a second input (sdi) of the second flip-flop 514. Similarly, an output (Q) of a second flip-flop 514 is fed back into a first input (D) of the second flip-flop 514 and into a second input (sdi) of the next flip-flop (not shown), and so on up to the $n^{th}$ flip-flop, where a second input (sdi) of the $n^{th}$ flip-flop 516 is operably coupled to an output of the ($n^{th}$–1) flip-flop (not shown), and the output of the $n^{th}$ flip-flop 516 is fed back into a first input (D) of the $n^{th}$ flip-flop 516, and is used to provide the clock timing violation signal 135. The second input (sdi) of the first flip-flop 512 is arranged to receive a 'scan' signal 530 from an external source, which for the illustrated example comprises a supply voltage signal VDD. The flip-flops 512, 514, 516 are operably coupled in a chain in this manner to form a shift register as described below.

Each of the flip-flops 512, 514, 516 of the clock timing violation signal configuration module 510 is further arranged to receive the indication of a timing discrepancy 230 at an input control port (se) thereof, and the clock signal 120 at a clock port therefor. In this manner, each flip-flop 512, 514, 516 is arranged to set its output (Q) (upon each trigger edge of the clock signal) equal to one of its inputs (D, sdi) depending on the indication of a timing discrepancy 230. For example, let us consider a case where an initial (cleared) state in which all the flip-flops 512, 514, 516 are configured to output a '0' state, and the scan signal 530 is configured to comprise a '1' state. The flip-flops 512, 514, 516 may be arranged to receive power on reset to re-initialise their output states to '0'. If the indication of a timing discrepancy 230 comprises, say, a '0' state indicating that no timing discrepancy has been detected, such that each flip-flop 512, 514, 516 will set its output equal to its first input (D), then whilst the timing discrepancy indication 230 comprises such a '0' state (i.e. whilst no timing discrepancies are detected), the flip-flops 512, 514, 516 will be caused to set their outputs (Q) equal to their first inputs (D) upon trigger edges of the clock signal 120, and as such will maintain their current states. However, upon detection of a timing discrepancy, the state of the timing discrepancy indication 230 will change to, in this example, a '1' state. As such, each flip-flop 512, 514, 516 will be caused to set its output (Q) equal to its second input (sdi). As a result, the first flip-flop 512 will subsequently set its output equal to the scan signal 530 upon the next clock trigger edge, and the remaining flip-flops 514, 516 will be caused to set their outputs equal to the state being output by the preceding flip-flop. Thus, for the first detected timing discrepancy, the output of the first flip-flop 512 will be set from a '0' to a '1'. However, for the remaining flip-flops 514, 516, since their respective preceding flip-flops at the instant of the active clock edge are outputting values of '0', their outputs will remain as '0' following a single clock trigger edge. For each subsequent clock trigger edge upon which the detection of a timing discrepancy is indicated, the '1' value originating from the scan signal 530 will shift along another flip-flop 512, 514, 516, until it reaches the $n^{th}$ flip-flop 516, and is finally output within the clock timing violation signal 135.

Accordingly, for the example illustrated in FIG. 5, the clock monitor 130 is arranged to configure the clock timing violation signal 135 to indicate that a clock timing violation has occurred upon a detection of timing discrepancies coinciding with n trigger edges of the clock signal 120. For the illustrated example, the clock timing violation signal configuration module 510 illustrated in FIG. 5 comprises a cumulative timing violation counter arranged to simply count a number of clock trigger edges with which the detection of timing violations coincide. In alternative examples, the clock timing violation signal configuration module 510 may alternatively comprise a consecutive timing violation counter, wherein the clock monitor 130 may be arranged to configure the clock timing violation signal 135 to indicate that a clock timing violation has occurred upon the detection of timing discrepancies coinciding with n consecutive trigger edges of the clock signal 120.

For some example embodiments, the flip-flops 512, 514, 516 may be capable of functioning at high clock frequencies such that they are capable of propagating a clock timing violation signal there through after n consecutive trigger edges even with a defect clock signal. This may be achieved by configuring such flip-flops 512, 514, 516 to form a shift register without any combinatory logic between the flip-flops 512, 514, 516.

Figure 6:
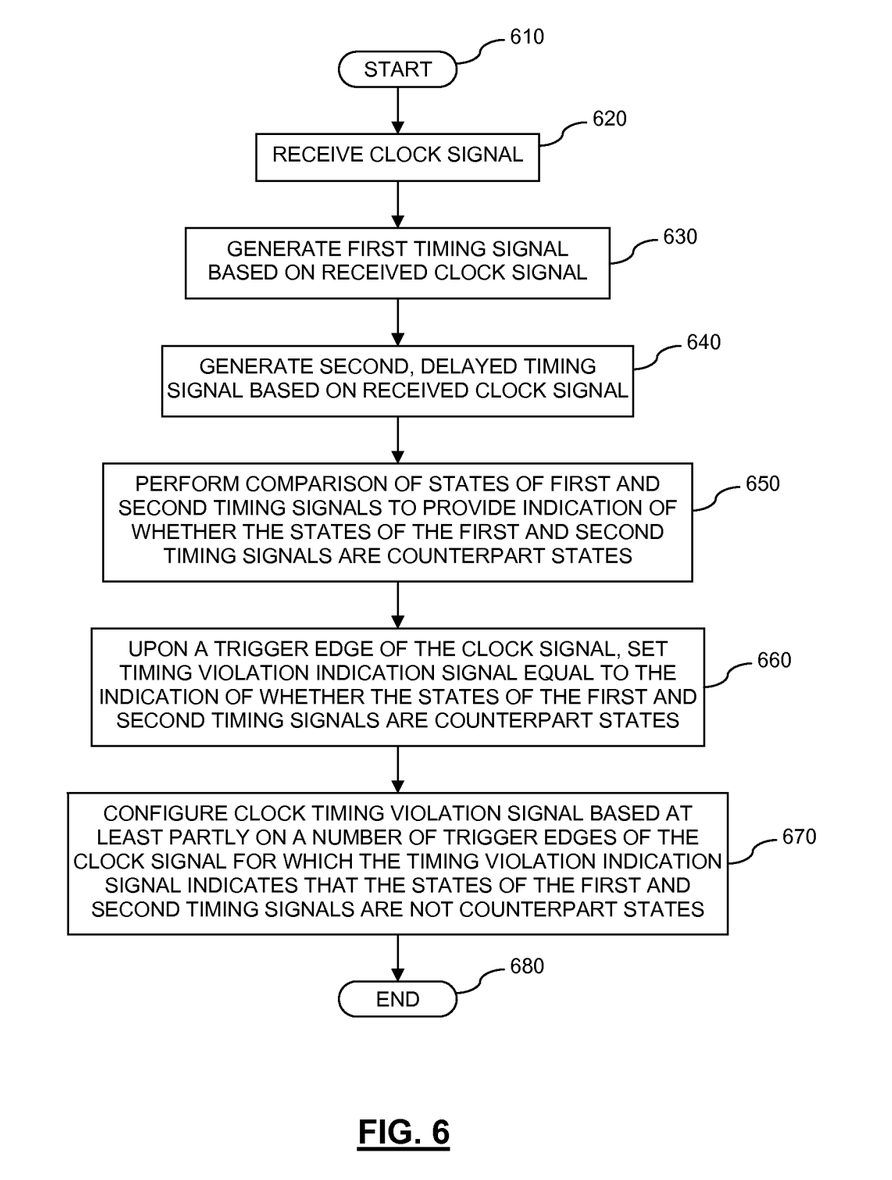
FIG. 6 illustrates a simplified flowchart of an example of a method for detecting timing violations within a clock signal.

Referring now to FIG. 6, there is illustrated a simplified flowchart 600 of an example of a method for detecting timing violations within a clock signal. The method starts at step 610 and moves on to step 620 with a receipt of a clock signal. A first timing signal arranged to toggle between states in response to a trigger edge of the clock signal is generated at 630, and a second timing signal arranged to toggle between states in response to a trigger edge of the clock signal such that a state transition of the second timing signal in response to a trigger edge of the clock signal is delayed by a period T with respect to the trigger edge of the clock signal in response to which that transition occurs, is generated at step 640. A comparison of the states of the first and second timing signals is then performed at step 650 to provide an indication of whether the states of the first and second timing signals are counterpart states. Next, at step 660, a timing violation indication signal is set to be substantially equal to the indication of whether the states of the first and second timing signals are counterpart states upon a trigger edge of the clock signal. A clock timing violation signal is then configured, based at least partly on a number of trigger edges of the clock signal for which the timing violation indication signal indicates that the states of the first and second timing signals are not counterpart states. The method then ends at step 680.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, for clarity and ease of understanding the clock monitor has been illustrated and described as conceptually comprising separate timing signal and detection modules. However, it will be appreciated that the functionality provided by these modules may be integrated into a single physical module or divided amongst any number of physical modules.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising at least one clock monitor, the at least one clock monitor comprising:
   a timer arranged to:
      receive a clock signal;
      generate a seed timing signal arranged to toggle between states in response to a trigger edge of the clock signal;
      invert the seed timing signal to generate a first timing signal; and
      delay the seed timing signal by a period T to generate a second timing signal, the period T less than a period of the dock signal; and
   a detector arranged to:
      receive at a first input thereof the first timing signal;
      receive at a second input thereof the second timing signal;
      compare states of the first and second timing signals; and
      generate an indication of a timing discrepancy signal based at least partly on the comparison of the first and second timing signals.

2. The integrated circuit device of claim 1 wherein the timer generates a state transition delay of the second timing signal of $T_{func}+\Delta t$, where $T_{func}$ represents a signal propagation time for a critical path within at least one functional block of the integrated circuit device, and $\Delta t$ represents a differential timing offset value.

3. The integrated circuit device of claim 2 wherein the timer comprises a timing signal path through which the second timing signal is arranged to propagate, wherein at least a part of the timing signal path is representative of a critical path within at least one function block of the integrated circuit device.

4. The integrated circuit device claim 3 wherein the detector further comprises a timing violation detector arranged to: receive an indication of whether the states of the first and second timing signals are counterpart states.

5. The integrated circuit device of claim 3 wherein the at least one clock monitor further comprises a clock timing violation signal configuration module operably coupled to the output of the detector and arranged to:
   receive the indication of a timing discrepancy; and
   configure the clock timing violation signal based at least partly on a number of indicated timing discrepancies.

6. The integrated circuit device claim 2 wherein the detector further comprises a timing violation detector arranged to: receive an indication of whether the states of the first and second timing signals are counterpart states.

7. The integrated circuit device of claim 2 wherein the at least one clock monitor further comprises a clock timing violation signal configuration module operably coupled to the output of the detector and arranged to:
   receive the indication of a timing discrepancy; and
   configure the clock timing violation signal based at least partly on a number of indicated timing discrepancies.

8. The integrated circuit device of claim 1 wherein the detector further comprises a timing violation detector arranged to:
   receive an indication of whether the states of the first and second timing signals are counterpart states.

9. The integrated circuit device of claim 8 wherein the timing violation detector is arranged to:
   detect timing discrepancies within the clock signal based at least partly on the indication of whether the states of the first and second timing signals are counterpart states; and
   generates the indication of a timing discrepancy signal based at least partly on the detection of timing discrepancies within the clock signal.

10. The integrated circuit device of claim 9 wherein the timing violation detector is further arranged to:
    receive the indication of whether the states of the first and second timing signals are counterpart states;
    receive the clock signal; and
    upon a trigger edge of the clock signal, set an output equal to the indication of whether the states of the first and second timing signals are counterpart states.

11. The integrated circuit device of claim 10 wherein the at least one clock monitor further comprises a clock timing violation signal configuration module operably coupled to the output of the detector and arranged to:
    receive the indication of a timing discrepancy; and
    configure the clock timing violation signal based at least partly on a number of indicated timing discrepancies.

12. The integrated circuit device of claim 9 wherein the at least one clock monitor further comprises a clock timing violation signal configuration module operably coupled to the output of the detector and arranged to:
    receive the indication of a timing discrepancy; and
    configure the clock timing violation signal based at least partly on a number of indicated timing discrepancies.

13. The integrated circuit device of claim 8 wherein the timing violation detector comprises a comparator comprising at least one of an exclusive OR (XOR) logic gate, an exclusive NOR (XNOR) logic gate.

14. The integrated circuit device of claim 13 wherein the at least one clock monitor further comprises a clock timing violation signal configuration module operably coupled to the output of the detector and arranged to:
    receive the indication of a timing discrepancy; and
    configure the clock timing violation signal based at least partly on a number of indicated timing discrepancies.

15. The integrated circuit device of claim 8 wherein the at least one clock monitor further comprises a clock timing violation signal configuration module operably coupled to the output of the detector and arranged to:
    receive the indication of a timing discrepancy; and
    configure the clock timing violation signal based at least partly on a number of indicated timing discrepancies.

16. The integrated circuit device of claim 1 wherein the at least one clock monitor further comprises a clock timing violation signal configuration module operably coupled to the output of the detector and arranged to:
    receive the indication of a timing discrepancy; and
    configure the clock timing violation signal based at least partly on a number of indicated timing discrepancies.

17. The integrated circuit device of claim 1 wherein the detector comprises a comparator comprising at least one of an exclusive OR (XOR) logic gate, an exclusive NOR (XNOR) logic gate.

18. An electronic device comprising at least one clock monitor, the at least one clock monitor comprising:
    a timer arranged to:
       receive a clock signal;
       generate a seed timing signal arranged to toggle between states in response to a trigger edge of the clock signal;
       invert the seed timing signal to generate a first timing signal; and
       delay the seed timing signal by a period T to generate a second timing signal, the period T less than a period of the clock signal;

a detector arranged to:
receive at a first input thereof the first timing signal;
receive at a second input thereof the second timing signal;
compare states of the first and second timing signals; and
generate an indication of a timing discrepancy signal based at least partly on the comparison of the first and second timing signals.

19. A method for detecting timing violations within a clock signal, the method comprising:
receiving a clock signal;
generating a seed timing signal arranged to toggle between states in response to a trigger edge of the clock signal;
generating a first timing signal by inverting the seed timing signal;
generating a second timing signal by delaying the seed timing signal by a period T, the period T less than a period of the clock signal;
comparing states of the first and second timing signals; and
generating a timing violation signal based at least partly on the comparison of the first and second timing signals.

20. The method of claim 19 further comprising comparing states of the first and second timing signals using at least one of an exclusive OR (XOR) logic function, an exclusive NOR (XNOR) logic function.

\* \* \* \* \*